(12) United States Patent
Wu et al.

(10) Patent No.: US 7,447,970 B2
(45) Date of Patent: Nov. 4, 2008

(54) SOFT-DECISION DECODING USING SELECTIVE BIT FLIPPING

(75) Inventors: Yingquan Wu, Urbana, IL (US); Gregory L. Silvus, Boulder, CO (US); Thomas V. Souvignier, Longmont, CO (US)

(73) Assignee: Seagate Technology, Inc., Scotts Valley, CA (US)

( * ) Notice: Subject to any disclaimer, the term of this patent is extended or adjusted under 35 U.S.C. 154(b) by 533 days.

(21) Appl. No.: 10/869,447

(22) Filed: Jun. 16, 2004

(65) Prior Publication Data

US 2005/0283702 A1    Dec. 22, 2005

(51) Int. Cl.
H03M 13/00    (2006.01)
(52) U.S. Cl. ..................................... 714/751
(58) Field of Classification Search ............. 714/752, 714/751
See application file for complete search history.

(56) References Cited

U.S. PATENT DOCUMENTS

| | | | |
|---|---|---|---|
| 5,373,513 A * | 12/1994 | Howe et al. ........... 714/775 |
| 5,933,462 A | 8/1999 | Viterbi | |
| 5,936,972 A | 8/1999 | Meidan | |
| 6,389,574 B1 | 5/2002 | Belveze | |
| 6,434,719 B1 | 8/2002 | Livingston | |
| 6,480,552 B1 | 11/2002 | Tonello | |
| 6,484,285 B1 | 11/2002 | Dent | |
| 6,587,987 B1 | 7/2003 | Vasic | |
| 6,597,743 B1 | 7/2003 | Khayrallah | |
| 6,628,837 B1 | 9/2003 | Greene | |
| 6,665,357 B1 | 12/2003 | Somayazulu | |
| 6,671,338 B1 | 12/2003 | Gamal | |
| 6,691,263 B2 | 2/2004 | Vasic | |
| 6,697,441 B1 | 2/2004 | Bottomley | |
| 6,999,531 B2 | 2/2006 | Jin | |
| 2001/0054170 A1 | 12/2001 | Chass | |

OTHER PUBLICATIONS

Chan et al., A simple taboo-based soft decision decoding algorithm for expander codes, 1998, IEEE, p. 183-185.*

* cited by examiner

*Primary Examiner*—Shelly A Chase
(74) *Attorney, Agent, or Firm*—Cesari and McKenna, LLP

(57) ABSTRACT

A method or apparatus that can form and test a data block variant by flipping a selected potentially bad bit that is consecutive with 1 or 2 sequences of several potentially good bits of a received block. The variant correctability test is optionally repeated several times before receiving another data block, in the event of ECC failures, each repetition using a different block variant.

29 Claims, 5 Drawing Sheets

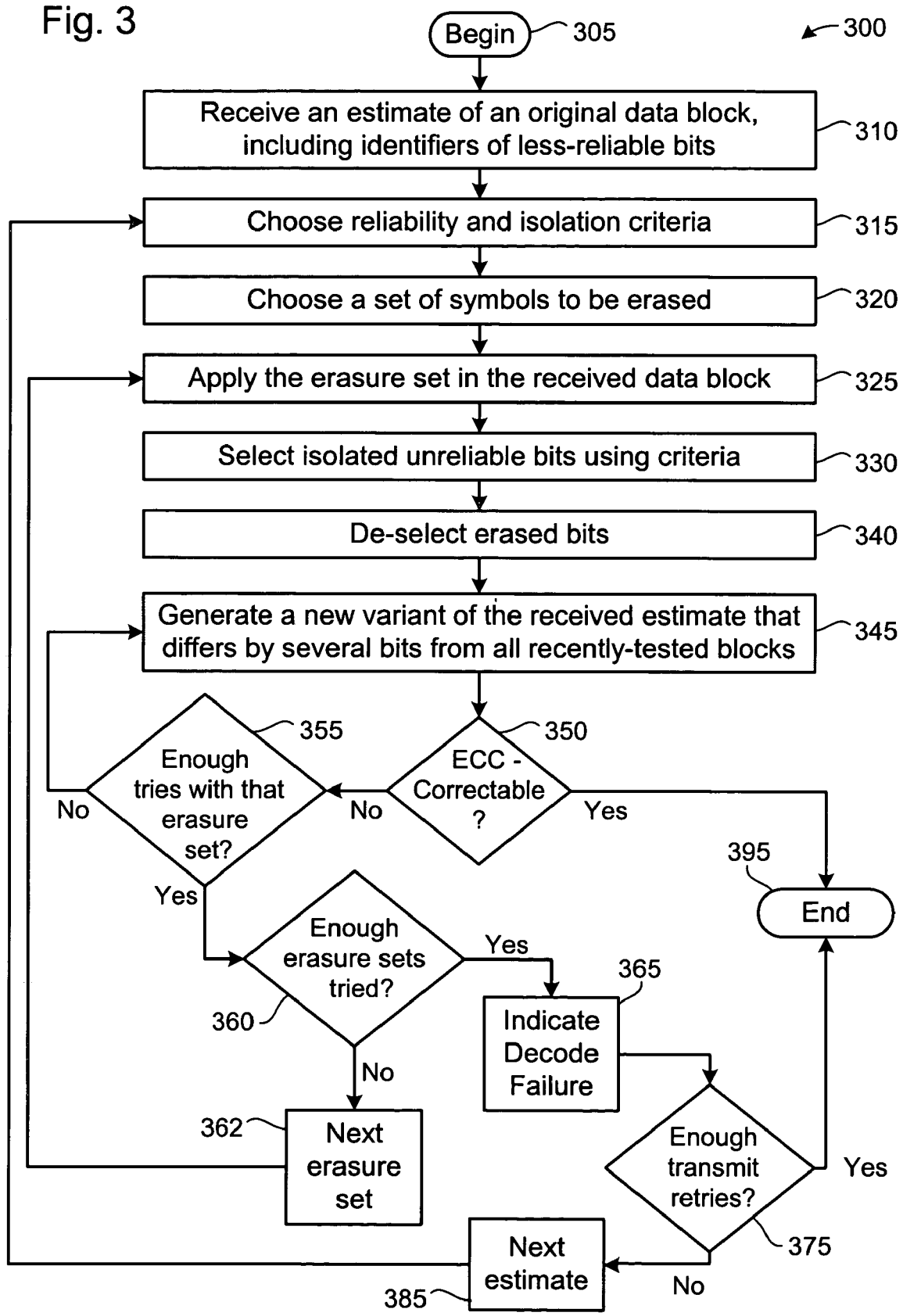

Fig. 4 (400, 422)

| row | 461 | 462 | 463 | 464 | 465 |
|---|---|---|---|---|---|
| 3867 | 1 | 0 | 0 | 0 | 0 |
|  | 1 | 0 | 0 | 0 | 0 |
|  | 1 | 0 | 0 | 1 | 0 |
|  | 1 | 0 | 0 | 1 | 1 |
|  | 1 | 0 | 0 | 0 | 1 |
|  | 1 | 0 | 0 | 1 | 1 |
|  | 1 | 0 | 0 | 0 | 0 |
|  | 1 | 0 | 0 | 0 | 1 |
|  | 1 | 0 | 0 | 0 | 1 |
| 3876 | 1 | 1 | 1 | 1 | 1 |
|  | 1 | 0 | 0 | 0 | 0 |
|  | 1 | 0 | 0 | 0 | 1 |
| 3879 | 1 | 1 | 0 | 0 | 0 |
| 3880 | 1 | 1 | 1 | 1 | 1 |
|  | 1 | 0 | 1 | 1 | 0 |
| 3882 | 1 | 0 | 1 | 1 | 0 |
| 3883 | 1 | 1 | 1 | 1 | 1 |
| 3884 | 0 | 0 | 0 | 1 | 1 |
| 3885 | 1 | 0 | 0 | 0 | 1 |
| 3886 | 1 | 1 | 1 | 1 | 1 |
|  | 1 | 0 | 0 | 0 | 0 |
|  | 1 | 0 | 1 | 1 | 1 |
|  | 1 | 0 | 1 | 1 | 0 |
| 3890 | 1 | 1 | 1 | 1 | 1 |
|  | 1 | 0 | 0 | 0 | 0 |
|  | 1 | 0 | 0 | 0 | 1 |
|  | 1 | 0 | 0 | 1 | 0 |
|  | 1 | 0 | 1 | 1 | 1 |
|  | 1 | 0 | 0 | 1 | 0 |
|  | 1 | 0 | 0 | 0 | 0 |
|  | 1 | 0 | 0 | 0 | 1 |
|  | 1 | 0 | 0 | 1 | 1 |
|  | 1 | 0 | 0 | 0 | 0 |
|  | 1 | 0 | 0 | 0 | 1 |
|  | 1 | 0 | 0 | 0 | 0 |
| 3902 | 1 | 0 | 1 | 0 | 1 |

Fig. 5 (530)

| 561 | 562 | 563 | | 528 |
|---|---|---|---|---|
| 18 | 2 | 15 | | 165 |
| 133 | 8 | 15 | | 388 |
| 164 | 8 | 15 | | 52 |
| 165 | 1 | 15 | | 110 |
| 165 | 3 | 15 | | 329 |
| 200 | 0 | 15 | | 13 |
| 204 | 1 | 15 | | 109 |
| 387 | 6 | 15 | | 150 |
| 388 | 0 | 15 | | 305 |
| 388 | 3 | 15 | | 377 |
| 388 | 6 | 15 | | |
| 389 | 0 | 15 | | |
| 396 | 6 | 15 | | |
| 396 | 9 | 15 | | |
| 402 | 6 | 15 | | |
| 236 | 9 | 13 | | |
| 397 | 4 | 13 | | |
| 358 | 4 | 12 | | |
| 398 | 6 | 11 | | |
| 165 | 0 | 8 | | |
| 387 | 9 | 8 | | |

Fig. 6 (630)

| 661 | 662 | 663 | | |
|---|---|---|---|---|
| 18 | 2 | 15 | | 165 |
| 133 | 8 | 15 | | 388 |
| 164 | 8 | 15 | | 52 |
| 200 | 0 | 15 | | 110 |
| 204 | 1 | 15 | | 329 |
| 387 | 6 | 15 | | 13 |
| 389 | 0 | 15 | | 109 |
| 396 | 6 | 15 | | 150 |
| 396 | 9 | 15 | | 305 |
| 402 | 6 | 15 | | 377 |
| 236 | 9 | 13 | | |
| 397 | 4 | 13 | | |
| 358 | 4 | 12 | | |
| 398 | 6 | 11 | | |
| 387 | 9 | 8 | | |

Fig. 7

| 731 | 732 | 761 | 762 |
|---:|---:|---:|---:|
| 18 | 2 | 62 | 1 |
| 133 | 8 | 133 | 8 |
| 164 | 8 | 236 | 9 |
| 165 | 1 | 358 | 4 |
| 165 | 3 | 398 | 6 |
| 200 | 0 | 402 | 6 |
| 204 | 1 | | |
| 387 | 6 | 2 | |
| 388 | 0 | 41 | |
| 388 | 3 | 48 | |
| 388 | 6 | 52 | |
| 389 | 0 | 53 | |
| 396 | 6 | 109 | |
| 396 | 9 | 110 | |
| 402 | 6 | 115 | |
| 236 | 9 | 131 | |
| 397 | 4 | 140 | |
| 358 | 4 | 150 | |
| 398 | 6 | 164 | |
| 165 | 0 | 165 | |
| 387 | 9 | 181 | |
| 52 | 6 | 203 | |
| 52 | 8 | 204 | |
| 53 | 0 | 247 | |
| 53 | 3 | 329 | |
| 62 | 1 | 377 | |
| 165 | 9 | 387 | |
| 166 | 0 | 388 | |
| 388 | 8 | 389 | |
| 389 | 4 | 396 | |
| ⋮ | ⋮ | 397 | |
| | | 401 | |

| | 871 | 872 | 873 | 874 | 875 | 876 | 877 | 878 | ... | 882 | 883 | 884 | 885 | 886 | 887 | ... |
|---|---|---|---|---|---|---|---|---|---|---|---|---|---|---|---|---|
| 821 → | 0 | 0 | 1 | 0 | 0 | 1 | 1 | 0 | | 0 | 1 | 1 | 0 | 0 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 823 → | 1 | 1 | 0 | 0 | 0 | 1 | 0 | 1 | | 1 | 0 | 0 | 1 | 0 | 1 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 825 → | 0 | | | | | | | | | 0 | 1 | 1 | 0 | 1 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 827 → | 0 | 0 | 1 | 0 | 0 | 0 | 1 | 0 | | 0 | 0 | 0 | 1 | 1 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 829 → | 1 | 1 | 1 | 1 | 0 | 0 | 0 | 1 | | 1 | 0 | 0 | 0 | 1 | 1 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 831 → | 1 | 1 | 0 | 0 | 0 | 0 | 0 | 1 | | 1 | 1 | 1 | 0 | 1 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 833 → | 0 | 0 | 0 | 0 | 0 | 0 | 0 | 0 | | 0 | 0 | 1 | 0 | 0 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 835 → | 1 | 1 | 1 | 0 | 1 | 1 | 0 | 0 | | 1 | 0 | 0 | 0 | 0 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 837 → | 0 | 0 | 0 | 1 | 1 | 1 | 1 | 0 | | | | | | | | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 839 → | 0 | 0 | 0 | 0 | 0 | 1 | 0 | 1 | | 0 | 0 | 0 | 0 | 1 | 1 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |
| 841 → | 1 | 1 | 1 | 1 | 0 | 0 | 1 | 0 | | 1 | 1 | 1 | 1 | 1 | 0 | |
| | ⋮ | ⋮ | ⋮ | ⋮ | ⋮ | ⋮ | ⋮ | ⋮ | | ⋮ | ⋮ | ⋮ | ⋮ | ⋮ | ⋮ | |

SOFT-DECISION DECODING USING SELECTIVE BIT FLIPPING

FIELD OF THE INVENTION

The present invention relates to a system for correcting errors in a data block. More particularly, the present invention relates to an improved way to form variants based upon an initial estimate of a data block.

BACKGROUND OF THE INVENTION

In storage and communication channels, data must be retrieved and transmitted reliably. In many such systems two major components protect the reliability of data: the detector and the error correcting code (ECC). The detector converts an analog waveform to a digital waveform, and then transmits the data in the digital waveform as ones and zeros. The ones and zeros are transmitted to the ECC where any erroneous bytes or symbols are corrected if the errors are within the ECC's capability.

In some such systems an information message is translated into a binary sequence. In a Reed-Solomon (RS) Encoder block, for example, the binary information sequence is segmented into sequences of m-bit symbols, where m is commonly 8 or 10. Parity symbols are added to each sequence of information symbols to form codewords. The method used to calculate the parity symbols determines the type of encoder. The output of the RS Encoder block consists of many codewords, where each n-symbol codeword consists of k information symbols and r=n–k parity symbols, forming a rate k/n code.

The channel introduces noise into the system to form the noisy sequence Y. The detector determines the most probable binary sequence $\hat{X}$, an estimate of X. Since noise was added to the system, with some probability, $\hat{X}$ will contain errors. The RS decoder block uses the parity symbols to attempt to correct any symbol errors in $\hat{X}$. One ECC scheme is hard-decision algebraic decoding, such as provided by the Berlekamp-Massey or the Berlekamp-Welch algorithms. Either of these algorithms generally exhibits an "ECC power" of correcting t symbol errors, where $t=\lfloor d/2 \rfloor$ denotes the error-correcting radius (for an (n, k) RS code, the minimum distance d equals n–k+1).

The detector can use quality information from the digital waveform to detect data more accurately, but this quality information is not generally sent to the ECC (RS Decoder). A variety of "Soft-Decision ECC" schemes would allow quality ("soft") information to be used by the ECC, thereby improving the capability of the ECC (or "extending" the ECC power). In such systems the ECC typically computes two pieces of information: error location and error magnitude. If soft information can provide the error location(s), the ECC is generally enabled to compute a larger number of the magnitudes.

One limitation of conventional Reed-Solomon ECC and similar schemes is that they correct symbols rather than bits. Even if only a single bit is in error, an entire symbol (typically 8 or 10 bits) or two of correction is used up. The ECC scheme defines a theoretical maximum on how many symbols can be corrected. Symbol erasures can be used to enlarge this theoretical maximum somewhat, generally less than double. What is needed is a way to extend further the error correction power in Reed-Solomon and similar systems.

SUMMARY OF THE INVENTION

The present invention is a method or apparatus that can form and test a data block variant by flipping a selected bit that is consecutive with one or two (contiguous) sequences of several potentially good (i.e. apparently reliable) bits of a received block. Flipping a wisely-selected set of the less-reliable bits in this way makes better use of quality information and conserves system resources while enhancing the likelihood of a successful block correction. And unlike symbol erasures, the number of bit flips that can be used to reconstruct the original data block does not have a theoretical maximum defined by the ECC scheme.

A first embodiment of the present invention is a method comprising a step of performing a variant correctability test upon a data block variant formed from a received data block by a variation process that includes flipping a potentially bad bit that is consecutive with several potentially good bits of the received block. The variant correctability test is optionally repeated several times before receiving another data block, each repetition using a different block variant. Optionally another block is subsequently received, each of the received data blocks being an estimate of one original data block.

In a second embodiment, the performing step is done so that the data block variant includes at least 1-2 erased symbol(s) and so that the erased symbol(s) do not contain any flipped bits. All of the symbols have N bits, and the flipped bit is preferably selected as an unreliable bit isolated enough so that the other N-1 bits are all reliable, in the symbol that contains the flipped bit.

In a third embodiment, an original data block is first sent into a storage or transmission medium where degradation can occur. The received data block is later derived from this original data block. During the decode operation, a control block performs the flip-bit selection based at least partly on an arithmetic combination of scalar evaluations of each of the several potentially good bits.

A fourth alternative embodiment of the present invention is a method including at least four steps. The first step is determining whether to perform a variant correctability test upon a data block variant based solely on whether a received data block is correctable. The second step is selecting at least partly based on at least first, second, and third non-overlapping bit reliability categories so that the first category includes many selected bits, so that the second category includes several potentially good non-selected bits, so that the third category includes several other non-selected bits of the received block, and so that each of the selected bits meets at least one predetermined criterion of a minimum mutual isolation. The third step is forming the data block variant by flipping several of the many selected received bits, the flipped bits each consecutive with 2 sequences of several potentially good bits of the received block and by erasing several symbols each consisting of some of the non-selected bits. The fourth step is determining, based on the variant correctability test, whether to perform another variant correctability test upon another data block variant formed by flipping another of the selected bits.

A fifth alternative embodiment is a method comprising a step of determining based on a received data block whether to perform a variant correctability test upon a data block variant formed by flipping a first potentially bad bit that is consecutive with several potentially good bits of the received block. This first variant correctability test is then used to determine whether to perform another variant correctability test.

A sixth alternative embodiment is an apparatus configured to perform one of the above-described methods of the present invention. The apparatus includes a medium within which a data block is vulnerable to degradation.

At least one example of each of the above-mentioned embodiments is shown and described in detail below. Additional features and benefits will become apparent upon reviewing the following figures and their accompanying description.

BRIEF DESCRIPTION OF THE DRAWINGS

FIG. 3 shows a flowchart of another method the present invention.

FIG. 4 shows a raw quality series that includes a data block and related reliability information.

FIG. 5 shows an ECC block for use in the present invention.

FIG. 6 shows another ECC block for use in the present invention

FIG. 7 shows another control circuit of the present invention.

FIG. 8 shows a series of versions derived from a common data block, useful for reconstructing the data block.

DETAILED DESCRIPTION

Figure 1:
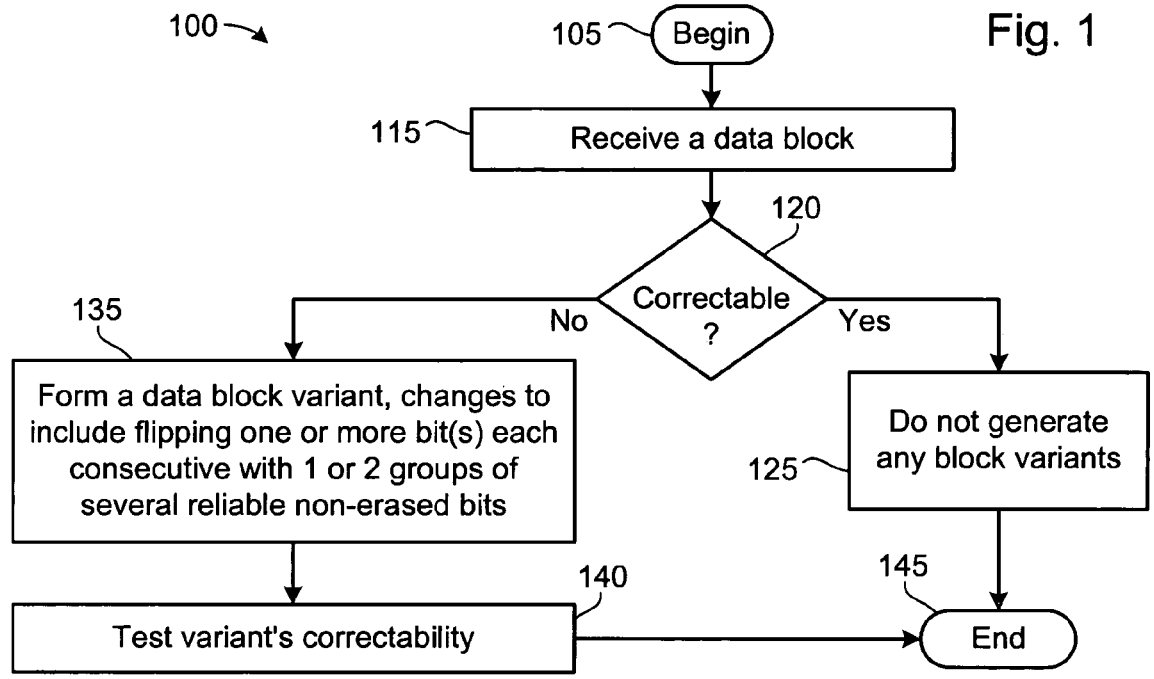
FIG. 1 shows a flowchart of a method of the present invention.

Although the examples below show more than enough detail to allow those skilled in the art to practice the present invention, subject matter regarded as the invention is broader than any single example below. The scope of the present invention is distinctly defined, however, in the claims at the end of this document.

To avoid needless distractions from the essence of the present invention, like-numbered reference numerals appearing in a later figure refer to the same elements as those in an earlier figure. Also, numerous aspects of basic engineering and of positioning technologies that are not a part of the present invention (or are well known in the art) are omitted for brevity. For example, this document does not articulate detailed and diverse methods for writing microcode or building logic circuits to implement an arithmetic combination. Neither does it include implementation decisions such as what exact Reed-Solomon or other encoder to use. Specific techniques for assembling and interacting with storage or transmission media are likewise omitted, typically being a matter of design choice to those of ordinary skill in that field of technology.

Definitions and clarifications of certain terms are provided in conjunction with the descriptions below, all consistent with common usage in the art but some described with greater specificity. A "sequence" of bits or symbols is a consecutively-placed group of values in a linear stream, not a group that is interspersed with other values. A "reliable" or "potentially good" bit is one that has a reliability indicator higher than a predetermined threshold and/or an error likelihood indicator lower than a predetermined threshold, for example. An "unreliable" or "potentially bad" bit is one that has a reliability indicator lower than a predetermined threshold and/or an error likelihood indicator higher than a predetermined threshold. The threshold is preferably based on empirically derived values of many bits expressed in terms of the selected reliability or likelihood indicator.

Turning now to FIG. 1, there is shown a flowchart of a method 100 of the present invention, comprising steps 105 through 145. A data block is received 115. If it is correctable 120, such as by an ordinary Error Correction Code, no variants are generated 125, and the method 100 is deemed successful 145. If the data block is not correctable 120, a data block variant is formed 135. At least one potentially bad bit is identified (such as with soft ECC/quality information) that is isolated, apparently not among other unreliable bits. The variant is then tested 140 for correctability.

Figure 2:
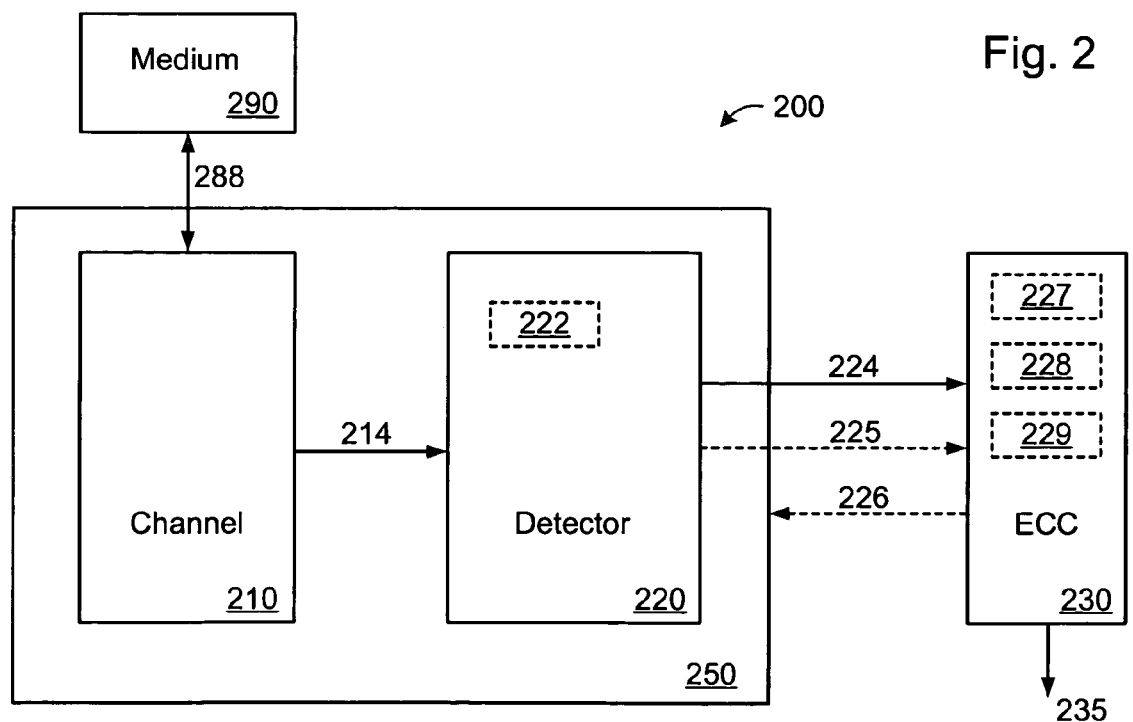
FIG. 2 shows an apparatus of the present invention, including a transmission or storage medium within which a data block will be subject to degradation.

FIG. 2 shows an apparatus 200 of the present invention configured to perform any or all of the methods described in this document. It includes a transmission or storage medium 290 that is subject to some form of data degradation, an integrated circuit 250, an ECC control block 230, and signal lines. Detector 220 is configured to received data 214 from channel 210 which has interactions 288 with medium 290. Detector 220 optionally contains a buffer 222 containing log likelihood ratios, distances from nearest defined symbols, empirical pattern recognition, and/or other reliability-indicative or soft ECC data each associated with selected portions of a block of the received data 214. Optionally the reliability-indicative data may be partly based on analog information included in the received data 214. In this case the detector 220 creates the reliability-indicative data partly based on digitized measurements of the analog information.

A portion 225 of the reliability-indicative data is optionally sent to ECC 230 along with the data block 224 with which the portion 225 is associated. This portion 225 is used to generate a several data objects 227,228,229 within ECC 230. In one embodiment, the data objects include a potentially bad bit series 227, a potentially bad symbol series 228, and a flip-bit series 229. ECC 230 uses these objects 227,228,229 for systematic modification of the data block 224 and optionally returns an indication 226 of whether the modified data block is correctable. When the ECC 230 is successful, the corrected data block is provided as a system output 235.

FIG. 3 shows a flowchart of another method 300 of the present invention, comprising steps 305 through 395. As an example, method 300 is optionally performed by apparatus 200 of FIG. 2 upon the specific data given in one or more of the FIGS. 4-9. An estimate of an original data block is received 310 into ECC block 230, including identifiers of less-reliable bits. ECC block 230 chooses reliability and isolation criteria 315 and a set of multi-bit symbols to be erased 230. The chosen symbols are erased 325, and then some of the non-erased bits are selected 330 using the criteria of step 315. Preferably any selected bits in the erased symbols are de-selected 340 to conserve resources. Then a new variant is generated 345 and tested 350, preferably one that differs by several bits from the as-received block(s) and all variants. If the variant is correctable the method 300 was successful. Otherwise, if more variants with that erasure set are warranted and resources permit (as determined by an iteration count threshold comparison at step 355), another variant is generated 345 and tested 350. Otherwise, if other erasure sets are warranted and resources permit (as determined by an iteration count threshold comparison at step 360), a new erasure set is generated 362 and applied 325.

If enough variants and enough erasure sets have been tried, the attempt to decode the received block (estimate) is deemed a failure 365. If possible, then, another estimate is obtained 385, such as by receiving a second estimate of the data block from medium 290. The new estimate can even be a combination of the first and second readings, with differing bits between the two deemed less reliable than consistent bits. If no new estimate can be transmitted 375, the data reconstruction method 300 is deemed unsuccessful. See FIG. 8 for a specific example using 11 isolated potentially bad bits available for selection, 2 erasure sets and several variants generated for each erasure set.

FIG. 4 shows a raw quality series 400 residing in a buffer 422 which is optionally used as buffer 222 of FIG. 2 (simultaneously or sequentially). In series 400 each of the rows 3867-3902 corresponds with a corresponding bit of a data block to be decoded. Suppose that column 462 contains a preliminary estimate of the received data block 224 and column 461 contains a one-bit reliability indicator for each bit of the estimate. In column 461 a "1" signifies a reliable bit and the "0" in row 3884 signifies that bit 410 has been identified as potentially bad. Note that potentially bad bit 410 has a value of "0" in the preliminary estimate, but that the correctly decoded value may actually be "1." Although it may be possible to ascertain the correct value of potentially bad bit 410 by a conventional process of error correction, it will be appreciated that performing such a process with a wrong guess can cause the error correction process to fail. A better approach in some circumstances is to try testing block correctability with an untried value of the identified potentially bad bit(s).

As shown, potentially bad bit 410 is a desirable candidate for "flipping" by virtue of the fact that it is surrounded by reliable bits, and is therefore isolated from other bits identified as potentially bad. In particular, the potentially bad bit 410 can be selected so that at least P immediately preceding bits are all reliable, where 1<P<15. Potentially bad bit 410 can likewise be selected so that at least Q immediately succeeding bits are all reliable, where 1<Q<15. Each potentially bad bit 410 can also be selected so that the symbol containing the potentially bad bit contain only that one potentially bad bit. For a still narrower selection of potentially bad bits suitable for flipping, it can be further required that at least 2 to 5 symbols immediately before and/or after the symbol containing the potentially bad bit 410 all consist of reliable bits only.

In an alternative embodiment, raw quality series 400 contains additional, mutually independent indicators (e.g. elements in columns 463,464,465) relating to bit or symbol attributes, each pertinent to the bit or symbol associated with that row in the series. These indicators may show whether the "unreliability" determination is based on analog sample data, empirical similarity to previously-identified corrupt symbols, consistency with a previous estimate of the same original data block, indicia of isolation from other potentially bad bits, etc.

In another alternative embodiment, column 461 contains the preliminary estimate of the received data block. Each symbol of the block to be decoded contains ten bits. The last digit of the reference numeral gives the bit number of that row's bit, and the other digit(s) give the symbol number. Symbol 388, for example, contains an estimated value of "1111101111." The first-sent, least-significant bit is given in row 3880, which also contains 1's in columns 462,463,464, 465.

Suppose that these constitute a simple 4-digit binary "doubt level" value. In the instant scheme note that "0000" will indicate a minimal doubt, the level of doubt that will be assigned to bits that are most likely to be correct (e.g. bit 7 of symbol 388). Also note that "1111" (decimal 15) indicates a saturated doubt, the level of doubt that will be assigned for a 49.99% likelihood that a given better-guess bit (e.g. bit 0 of symbol 388) is correct. Intermediate doubt levels of doubt are defined for "0001" (i.e. decimal one) through "1110" (i.e. decimal 14) are also defined for the 4-bit doubt level given in series 400.

FIG. 5 shows an ECC block 530 for use in the present invention, optionally used as ECC block 230 in coordination with series 400 in buffer 222. Block 530 is optionally configured to perform the method of FIG. 1 or 3, for example. Block 530 includes a potentially bad bit series 527 and a potentially bad symbol series 528. Each row of potentially bad bit series 527 includes a symbol identifier (in column 561), a bit identifier (in column 562) and a doubt level (in column 563, expressed in decimal form). Bits 0, 3 and 6 of symbol 388 correspond respectively with rows 3880, 3883 and 3886 of FIG. 4, each bit having a doubt level of 15 as shown. Three other bits described in series 527 likewise correspond to rows 3876, 3879, and 3890 of FIG. 4. Thus it can be seen that series 527 is simply a summary derived from the contents of the complete raw quality series 400, only a part of which can be shown in FIG. 4.

Potentially bad symbol series 528 is also a summary derived from the contents of series 400. The series is defined as all of the symbols having a composite reliability below a predetermined threshold. In the present case the composite reliability of a given symbol is evaluated at least partly based on the doubt levels of several of the reliable bits in the given symbol. Several methods are taught below for computing such reliabilities. Also one of ordinary skill will recognize that various other methods of evaluating a given (estimated) symbol can be used with some embodiments of the present invention, in light of the present teachings. Some such methods are described, for example, in U.S. Pat. No. 6,480,552 ("Soft Output Metrics Generator for Symbol Detectors") issued 12 Nov. 2002 to Tonello; and in U.S. Pat. No. 6,434, 719 ("Error Correction Using Reliability Values for Data Matrix") issued 13 Aug. 2002 to Livingston.

Potentially bad bit series 527 identifies fifteen bits each having a high (saturated) doubt and six bits each having a moderate (e.g. non-saturated but at least 8) doubt, in the present data block. In addition to these two, series 527 implicitly classifies the other bits in the block in a third category, each bit in the third category having a low doubt (at or below 8). Despite the low doubt levels, it will be recognized that enough errors may nevertheless occur in these numerous bits that the data block will not initially be correctable. It is sometimes hard to determine how best to modify the block so as to increase the likelihood that the modified block will be correctable. It is generally better to try flipping bits in series 527, though, than to try flipping other bits in the block.

One approach for finding a successful modification is to try testing the correctability of the block with all possible combinations of the bits in potentially bad bit series 527. This will require more than 2 million ($2^{21}$) trials in the present case, however, illustrating why a less-selective approach like this can be cumbersome even for a very efficient ECC implementation.

Another approach is to erase all of the potentially bad symbols and to expand the potentially bad symbol series 528 to include all symbols that contain any bit in the potentially bad bit series. In the present case this will require the inclusion of 13 additional symbols: 18, 133, 164, 200, 204, 236, 358, 387, 389, 396, 397, 398, and 402. Erasing such a large number of additional symbols is a significant resource allocation and may be unfeasible.

FIG. 6 shows another ECC block 630 for use in the present invention, optionally used as ECC block 230 in coordination with series 400 in buffer 222. Block 630 is optionally a processor configured to perform the method of FIGS. 1 or 3, for example. Block 630 contains a potentially bad symbol series 628 and a flip-bit series 629, both derived from raw quality series 400 of FIG. 4. The process used or generating the potentially bad symbol series 628 is described first. An intermediate calculation is generated for a potentially bad bit of a selected symbol, the intermediate calculation being the sum of the 4-digit doubt levels of the 3 preceding bits and the 3 succeeding bits. For example, for bit 2 of symbol 388 (from values in series 400 near row 3882) this intermediate calculation is 8+15+6+15+3+1, which is 48 decimal. The selected symbol's reliability score, in this example, is the negative of the largest of the ten intermediate values for the selected symbol. None of the other intermediate calculations for symbol 388 of FIG. 4 are larger than 48, so symbol 388's reliability score is negative 48. In the present data block, this is the second lowest reliability score. The ten least reliable symbols of the block are given in series 628, in descending order of reliability.

The process used for generating flip-bit series 629 is described next. It should be noted that symbols 165 and 388 are in the potentially bad symbol series and are therefore available to be erased or likely to be ignored. Flip-bit series 629 is accordingly derived as all bits in the data block with a doubt level of at least 8 that are not identified in the potentially bad symbol series 628. The same series 629 can alternatively be derived as the 15 most-doubted bits in the data block that are not identified in the potentially bad symbol series 628. In a preferred method that avoids sorting, series 629 is derived first by collecting all of the rows with a doubt level of 15 as space permits in a fixed-length buffer. Then rows from each next-highest doubt level are added until the fixed-length buffer is filled, 15 rows in the present case. In a typical case, though, a simple threshold may be selected so as to avoid the need for any sorting.

With a flip-bit series 629 containing only 15 bits, there are 2^15 (32,768) potential combinations for which correctability can be tested. This is a significant improvement over the 2 million trials needed to evaluate series 527 of FIG. 5 fully, but it is still a large number. In a preferred embodiment, several steps are taken to enhance computational efficiency further. A computational budget of C correctability trials is given, and all combinations of the X most-doubted bits of series 629 are queued to be flipped, where X is the largest value for which 2^X<C. If C=5000 with this method, for example, X=12. In this case, all bits having a doubt threshold of 13 or larger are effectively deemed "unreliable" and all other bits are effectively deemed "reliable." Also, at least 1% of the combinations of the "saturated doubt" bits are tested before any of the "moderate doubt" bits are flipped.

In another preferred embodiment, the threshold of doubt is set much higher, which is to say that the threshold of reliability is set much lower. This can be accomplished, for example, by setting X so that C<2^X<C+20. In this way it is generally easy to produce a flip-bit series of at least 30 bits, and optionally more than 64 bits. With such a large flip-bit series, it is not generally feasible to test all combinations of bit values for block correctability within a reasonable computational budget. The emphasis in this case is to test a diverse selection of the combinations, preferably by an approach described below with reference to FIG. 8.

FIG. 7 shows another control circuit 700 of the present invention containing a series 727 of identifiers of doubted bits, a selected subset 729 of series 727, and a series 728 of symbol identifiers. Circuit 700 is optionally configured to perform the method of FIG. 1 or 3, for example. Each bit in series 727 is identified by a symbol number 731 and a bit number 732. Each bit in subset series 727 is similarly identified by a symbol number 761 and a bit number 762. These series 727,728,729 can be stored in the detector 220 and/or ECC 230 of FIG. 2, or they can be determined and used sequentially, without being stored. Symbol identifier series 728 can be determined in a manner similar to that of potentially bad symbol series 628 of FIG. 6, but using a simpler calculation to obtain each bit's calculation. Relative to each selected bit, doubt levels of all bits of the selected symbol, the previous symbol and the next symbol are simply added. For any bit of symbol 388 (from near symbol 388 of FIG. 4) this doubt-indicative calculation is (3+1+3+0+1+1+15+1+1+8)+ (15+6+6+15+3+1+15+0+7+6)+(15+0+1+2+7+2+0+1+3+0), which is 139 decimal. Note that this is less costly than prior embodiments in that only one such calculation need be performed for each symbol. The 25 least reliable symbols of the block are given in series 728 according to this system of evaluation.

Noting the many symbols in series 728 are available to be erased or likely to be ignored, many of the doubted bits identified in series 727 need not be flipped. Subset series 729 is accordingly derived as all bits in the data block deemed potentially bad (above a given threshold of doubt) that are not within any of the symbols of series 728. In sum, FIG. 7 demonstrates that a series of potentially bad symbols that is better aligned with a series of doubted bits allows a short flip-bit series 729 to account for an even larger set of potentially bad bits (e.g. the first 25 listed in series 727). It is still generally preferable to flip isolated doubted bits, however, leaving the symbol otherwise intact to which the isolated doubted bit belongs.

FIG. 8 shows a preliminary data block 871 that estimates the value of an original data block, and a series of several variants 872,873,874,875,876,877,878,879,882,883,884, 885,886,887 of the preliminary data block 871. Values of several potentially bad bits 821,823,825,827,829,831,833, 835,837,839,841 of each of the data block versions 871-887 are shown explicitly, with the content of sequences of many reliable bits indicated by ellipses, interleaved with the potentially bad bits. Within each one of the block versions 871-887, most of the potentially bad bits 823-841 are each situated in a respective block portion among several reliable bits. Each of these is consecutive with 2 sequences of several potentially good bits. The first variant 872 has all potentially bad bits un-flipped, but includes an erased symbol containing potentially bad bit 825. Variant 873 has four potentially bad bits 821,823,827,831 flipped. Variant 874 has a different set of four potentially bad bits 823,831,835,837 flipped. The next four variants 875,876,877,878 have sets of 5,6,7, and 3 bits flipped, respectively.

Preferably each new variant has a set of bits selected by a pseudo-random sequence generator from among an isolated potentially bad bit series. Preferably most of the inter-variant transitions will cause at least 4-5 of these bits to transition, but not more than 70% of these bit values should usually be flipped within a given variant. Also it is preferable that at least one of the flip-bits should be kept in its un-flipped state more than 70% of the time. In FIG. 8, for example, bit 833 is "moderately unreliable" and is thus kept un-flipped in at least 80% of the variants formed. In accordance with the methods of FIG. 1 or 3, each of the variants 872-878 is found to be non-correctable, in sequence. Variant 882 is then formed as the preliminary data block 871 with a new symbol erasure set, distinct from that of variant 872. This manifests itself as an erased symbol that includes potentially bad bit 837, so that bit 837 need not be a "selected bit" on the flip-bit list. Suppose now that variants 882-887 are formed and each found to be non-correctable. In the context of FIG. 3, suppose also that 2 erasure sets are "enough" at step 360, so that a decode failure occurs 365. At this point the best chance for data recovery is a re-transmit used to generate a new estimate 385, without which the data recovery method fails 395.

In another preferred embodiment, a method, each flip-bit series for the embodiment of FIG. 8 is selected to include several isolated potentially bad bits each of which is the only unreliable bit (i.e. below a predetermined reliability threshold) in its respective symbol. A symbol erasure series is generated later so as to exclude any symbol that includes any bit in the flip-bit series. Choosing a symbol erasure series after the flip-bit series simplifies computation for the flip-bit selection step while allowing the most suitable selection of bits to be selected for flipping.

Alternatively characterized, a first embodiment of the present invention is a method (such as 100,300) comprising a step of performing a variant correctability test (such as 140, 350) upon a data block variant formed from a received data block by a variation process that includes flipping a selected, potentially bad bit (such as 831) that is consecutive with several potentially good bits of the received block. The variant correctability test is optionally repeated several times (such as by step 355) before receiving another data block, each repetition using a different block variant (such as by step 345). Optionally another block is subsequently received (such as by step 385), each of the received data blocks being an estimate of one original data block.

In a second embodiment, the performing step is done so that the data block variant includes at least 1-2 erased symbol(s) and so that the erased symbol(s) do not contain any flipped bits (such as by step 340). All of the symbols have N bits, and each flipped bit is preferably selected as a potentially bad bit isolated enough so that the other N-1 bits are all reliable, in the symbol that contains the flipped bit.

In a third embodiment, an original data block is first sent into a storage or transmission medium (such as 290) where degradation can occur. The received data block is later derived from this original data block. During the decode operation, a control block (such as 230) performs the flip-bit selection based at least partly on an arithmetic combination of scalar evaluations of each of the several potentially good bits (such as by step 330 implementing any of FIGS. 4-8).

A fourth alternative embodiment of the present invention is a method including at least four steps. The first step is determining whether to perform a variant correctability test upon a data block variant primarily based on whether a received data block is correctable (such as by step 120). The second step is selecting at least partly based on at least first, second, and third non-overlapping bit reliability categories so that the first category includes many selected bits, so that the second category includes several potentially good non-selected bits, so that the third category includes several other non-selected bits of the received block, and so that each of the selected bits meets at least one predetermined criterion of a minimum mutual isolation (such as by step 330 implementing any of FIGS. 4-8). The third step is forming the data block variant by flipping several of the many selected received bits, the flipped bits each consecutive with 2 sequences of several potentially good bits of the received block and by erasing several symbols each consisting of some of the non-selected bits (such as by step 345 implementing FIG. 8). The fourth step is determining, based on the variant correctability test, whether to perform another variant correctability test upon another data block variant formed by flipping another of the selected bits (such as by step 355).

A fifth alternative embodiment is a method comprising a step of determining based on a received data block whether to perform a variant correctability test upon a data block variant formed by flipping a first potentially bad bit that is consecutive with several potentially good bits of the received block (such as by method 100 or 300). This first variant correctability test is then used to determine whether to perform another variant correctability test (such as by step 355).

A sixth alternative embodiment is an apparatus configured to perform one of the methods of the present invention. The apparatus includes a medium within which a data block is vulnerable to degradation.

Although the computation methods and specific numerical examples described above with reference to FIGS. 4-8 above give useful methods for implementing unreliability and isolation criteria, it will be understood that an unlimited number of other criteria are likewise available to the skilled practitioner. Variations in the arithmetic computation and/or testing are easily suited to implement the present invention, for example, and many are a matter of mere design choice in light of the teachings above.

More generally, it is to be understood that even though numerous characteristics and advantages of various embodiments have been set forth in the foregoing description, together with details of the structure and function of various embodiments of the invention, this disclosure is illustrative only. Changes may be made in detail, especially in matters of structure and arrangement of parts within the principles of the present invention to the full extent indicated by the broad general meaning of the terms in which the appended claims are expressed. For example, the particular elements may vary depending on the particular position monitoring application while maintaining substantially the same functionality. Although the more detailed embodiments described above primarily relate to using arithmetic indicators based on neighboring bits for evaluating a bit's reliability, other applications can readily benefit from these teachings without departing from the scope and spirit of the present invention.

Moreover, it will be appreciated by those skilled in the art that the selection of a suitable mathematical description of a reliability categorization involves several trade-offs. The best solution will depend on the application, and except as specified in the claims, no particular solution to this trade-off is of critical importance to the present invention. A selection of designs will typically be available and readily derived, depending on the robustness and other performance characteristics required. One of ordinary skill will be able to use the above description to design and implement a variety of methods and apparatuss using suitable mathematical descriptions in light of the teachings above, without undue experimentation.

What is claimed is:

1. A method, comprising:
    receiving a data block having a plurality of bits, the data block having one or more incorrect bits;
    selecting one or more unreliable bits of the plurality of bits that are each consecutive with at least one sequence of a predetermined number of reliable bits;
    forming a data block variant of the data block by flipping at least one of the selected unreliable bits; and
    determining whether the data block variant is correctable.

2. The method as in claim 1, further comprising:
    correcting the data block variant in response to its being correctable.

3. The method as in claim 1, further comprising:
    repeating the selecting, forming, and determining for a plurality repetitions on the data block, each repetition resulting in a different data block variant.

4. The method as in claim 1, further comprising:
    receiving a second data block, each of the received data blocks being an estimate of one original data block; and
    performing the selecting, forming, and determining on the second data block.

5. The method as in claim 1, further comprising:
selecting the one or more unreliable bits so that each is situated in a respective N-bit symbol containing N−1 other bits that are reliable bits.

6. The method as in claim 1, further comprising:
selecting the one or more unreliable bits so that each is situated in a symbol that meets at least one criterion of mutual isolation from other symbols with unreliable bits.

7. The method as in claim 1, wherein the data block variant comprises at least one erased symbol, the at least one erased symbol not containing any flipped bits.

8. The method as in claim 1, further comprising:
selecting at least one symbol of the received data block that has a located unreliable bit; and
erasing the at least one symbol so as to exclude the located unreliable bit from the received data block.

9. The method as in claim 1, further comprising:
obtaining a scalar evaluation of each of the plurality of reliable bits; and
deriving the unreliable bit from an arithmetic combination of at least some of the scalar evaluations.

10. The method as in claim 1, further comprising:
storing an original data block in a storage medium subject to degradation; and
receiving the received data block from an original data block that has degraded.

11. The method as in claim 1, wherein the at least one sequence of a predetermined number of reliable bits succeeds each unreliable bit.

12. The method as in claim 1, wherein the at least one sequence of a predetermined number of reliable bits proceeds each unreliable bit.

13. The method as in claim 1, wherein selecting further comprises:
selecting one or more unreliable bits of the plurality of bits that are each between two sequences of a predetermined number of reliable bits.

14. The method as in claim 1, further comprising:
determining whether bits are reliable and unreliable based on soft information.

15. The method as in claim 14, further comprising:
utilizing a threshold of the soft information to determine whether bits are reliable and unreliable; and
changing the threshold to obtain a configured number of unreliable bits.

16. The method as in claim 1, wherein the selected one or more unreliable bits of the plurality of bits are each consecutive with at least one sequence of a predetermined number of reliable bits of a symbol that is consecutive with a plurality of symbols having all reliable bits.

17. The method as in claim 1, further comprising:
flipping a plurality of the selected unreliable bits to form the data block variant.

18. An apparatus, comprising:
a detector configured to receive a data block having a plurality of bits, the data block having one or more incorrect bits; and
error correction code (ECC) circuitry configured to i) select one or more unreliable bits of the plurality of bits that are each consecutive with at least one sequence of a predetermined number of reliable bits; ii) form a data block variant of the data block by flipping at least one of the selected unreliable bits; and iii) determine whether the data block variant is correctable.

19. The apparatus as in claim 18, wherein the EEC circuitry is further configured to correct the data block variant in response to its being correctable.

20. The apparatus as in claim 18, further comprising:
a storage medium configured to store the data block, wherein the storage medium is vulnerable to degradation.

21. The apparatus as in claim 18, further comprising:
a data channel configured to transmit the data block to the detector, wherein the data channel is vulnerable to degradation.

22. The apparatus as in claim 18, wherein the ECC circuitry is further configured to select the one or more unreliable bits so that each is situated in a respective N-bit symbol containing N−1 other bits that are reliable bits.

23. The apparatus as in claim 18, wherein the ECC circuitry is further configured to select the one or more unreliable bits so that each is situated in a symbol that meets at least one criterion of mutual isolation from other symbols with unreliable bits.

24. The apparatus as in claim 18, wherein the data block variant comprises at least one erased symbol, the at least one erased symbol not containing any flipped bits.

25. The apparatus as in claim 18, wherein the ECC circuitry is further configured to:
select at least one symbol of the received data block that has a located unreliable bit; and
erase the at least one symbol so as to exclude the located unreliable bit from the received data block.

26. The apparatus as in claim 18, wherein the ECC circuitry is further configured to select one or more unreliable bits of the plurality of bits that are each between two sequences of a predetermined number of reliable bits.

27. The apparatus as in claim 18, wherein the detector is further configured to produce soft information for each bit of the received data block, and wherein the ECC circuitry is further configured to determine whether bits are reliable and unreliable based on soft information.

28. The apparatus as in claim 18, wherein the ECC circuitry is further configured to flip a plurality of the selected unreliable bits to form the data block variant.

29. An apparatus, comprising:
means for receiving a data block having a plurality of bits, the data block having one or more incorrect bits;
means for selecting one or more unreliable bits of the plurality of bits that are each consecutive with at least one sequence of a predetermined number of reliable bits;
means for forming a data block variant of the data block by flipping at least one of the selected unreliable bits; and
means for determining whether the data block variant is correctable.

* * * * *